(12) United States Patent
Arai

(10) Patent No.: US 6,323,707 B1
(45) Date of Patent: Nov. 27, 2001

(54) OUTPUT SIGNAL LEVEL CONTROL CIRCUIT IN A SEMICONDUCTOR DEVICE

(75) Inventor: Kenji Arai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/493,156

(22) Filed: Jan. 28, 2000

(30) Foreign Application Priority Data

Feb. 4, 1999 (JP) .................................................. 11-027913

(51) Int. Cl.[7] ...................................................... H03K 5/02
(52) U.S. Cl. .......................... 327/178; 327/331; 327/362; 327/378; 363/21.01; 363/25; 326/34
(58) Field of Search ................................. 327/172–174, 327/176, 178–180, 108, 109, 111, 112, 362, 37 D, 306, 309, 312, 315, 322, 331; 363/25, 26, 21.01; 326/32–34, 82

(56) References Cited

U.S. PATENT DOCUMENTS 4,316,155 * 2/1982 Hanisko .................................. 331/18
5,644,481 * 7/1997 Konishi et al. ......................... 363/21

FOREIGN PATENT DOCUMENTS

| 3-38862 | 2/1991 | (JP) . |
| 5-242681 | 9/1993 | (JP) . |
| 6-96586 | 4/1994 | (JP) . |
| 7-131316 | 5/1995 | (JP) . |
| 9-139656 | 5/1997 | (JP) . |

* cited by examiner

Primary Examiner—Tuan T. Lam
Assistant Examiner—Minh Nguyen
(74) Attorney, Agent, or Firm—Volentine Francos, PLLC

(57) ABSTRACT

A pulse signal output circuit charges and discharges a capacitor in response to a clock signal and outputs a pulse signal having a pulse width determined by a time for charging and discharging the capacitor. A control signal generation circuit outputs a control signal in response to the pulse signal, where the control signal has a first voltage level determined by the pulse width. An output circuit has a first output transistor and a first regulating transistor connected in series between the first power supply node and the output terminal. The first output transistor is operated in response to a signal transferred from inside or outside a semiconductor device, and the first regulating transistor is operated in response to the control signal.

16 Claims, 8 Drawing Sheets

101: OUTPUT CIRCUIT

3: VARIATION DETECTOR

4: CONTROL SIGNAL GENERATION CIRCUIT 5-1: OUTPUT CIRCUIT

NODE N9

Sout

OUTPUT SIGNAL LEVEL CONTROL CIRCUIT IN A SEMICONDUCTOR DEVICE

BACKGROUND OF THE INVENTION

The invention relates to a semiconductor device provided with an output circuits each outputting a high frequency signal.

DESCRIPTION OF THE RELATED ART

In a semiconductor device, an input/output circuit has been conventionally configured with the use of a CMOS (Complementary Metal-Oxide Semiconductor). In this case, there has been such an effect that fabrication cost of a semiconductor device per se is reduced, and the power consumption in the semiconductor device is reduced, and the like. Particularly, if an input/output circuit which satisfies an ECL (Emitter-Coupled Logic) interface standard is used for connecting between an LSI and an optical module element, the interposition of a bipolar device is dispensed with.

While there is the advantage set forth above, there is such a drawback that an input/output circuit composed of a CMOS, particularly an output circuit is liable to vary in an output level of the semiconductor device due to variation in a power supply voltage, variation in ambient temperature, and variation in fabrication of wafers and the like. Variation in fabrication of wafers used here means that electric characteristics of an integrated circuit formed on some region of a wafer are different from those of an integrated circuit formed on a region other than the some region of the wafer, which occurs in a fabrication process of wafers.

As communications are recently increasing faster, a frequency of a transfer signal has been set to a higher level while an amplitude of the transfer signal has been set to a lower level. If the transfer signal becomes small in amplitude, there is a possibility that the transmit and receive of the transfer signal is rendered unstable by slight variation in an output level. That is, it is necessary to suppress variation in an output level to the minimum so as to realize a stable transmit and receive of the transfer signal.

To this end, there has been proposed a conventional output circuit as disclosed in Japanese Patent Laid-Open Publication No. 9-186580. As shown in FIG. 1, an output circuit 101 is rendered enable in response to an output enable signal OE which is inputted via an input pad 102. A load 104 is charged or discharged in response to an input data signal INPUT which is inputted via an input pad 103 so that an output signal is transferred to the outside of the semiconductor device via an output pad 105. A first inverter means 106 and a second inverter means 107 output signals having voltage levels corresponding to variation in a power supply voltage Vcc and variation in ambient temperature to a NOR gate 108 and a NAND gate 109.

The NOR gate 108 and the NAND gate 109 supply either a signal of logical high level (hereinafter referred to as "H level") or a signal of a logical low level (hereinafter referred to as "L level") to a p-channel transistor 110 and an n-channel transistor 111 in response to voltage levels of signals outputted from the first and second inverter means 106, 107. Threshold voltages at the NOR gate 108 and the NAND gate 109 are accurately regulated.

With such an operation set forth above, a current outputted to the outside of the semiconductor device via the output pad 105 becomes a current regulated in response to variation in the power supply voltage Vcc and variation in ambient temperature. Accordingly, variation in a voltage level of an output signal outputted to the outside of the semiconductor device via the output pad 105 is suppressed to the minimum.

Although it is expected that the foregoing conventional output circuit has an effect that variation in a voltage level of an output signal caused by variation in the power supply voltage Vcc and variation in ambient temperature can be suppressed, threshold voltages at the NOR gate 108 and the NAND gate 109 for detecting variation in the output signal need be accurately regulated in a fabrication process of wafers so that variation in the voltage level of the output signal is hardly suppressed when there occurs variation in fabrication of wafers.

SUMMARY OF THE INVENTION

It is an object of the invention to provide a semiconductor device capable of transferring a high frequency signal having less amplitude while suppressing variation in a voltage level thereof even if there occur variation in a power supply voltage, variation in ambient temperature and variation in fabrication of wafers.

To achieve the above object, the semiconductor device according to the invention is provided with an output signal level control circuit comprising a pulse signal output circuit for charging or discharging a capacitor in response to a clock signal and outputting a pulse signal having a pulse width in response to time for charging or discharging the capacitor, a control signal generation circuit for outputting a control signal having a first voltage level in response to the pulse width, and output circuits for regulating a power supply voltage or a ground voltage supplied thereto respectively in response to the control signal and outputting output signals each having a second voltage level in response to the power supply voltage or the ground voltage.

DETAILED DESCRIPTION OF THE INVENTION

First Embodiment (FIGS. 2 to 10):

A semiconductor device according to a first embodiment is described now with reference to FIGS. 2 to 10.

Figure 2:
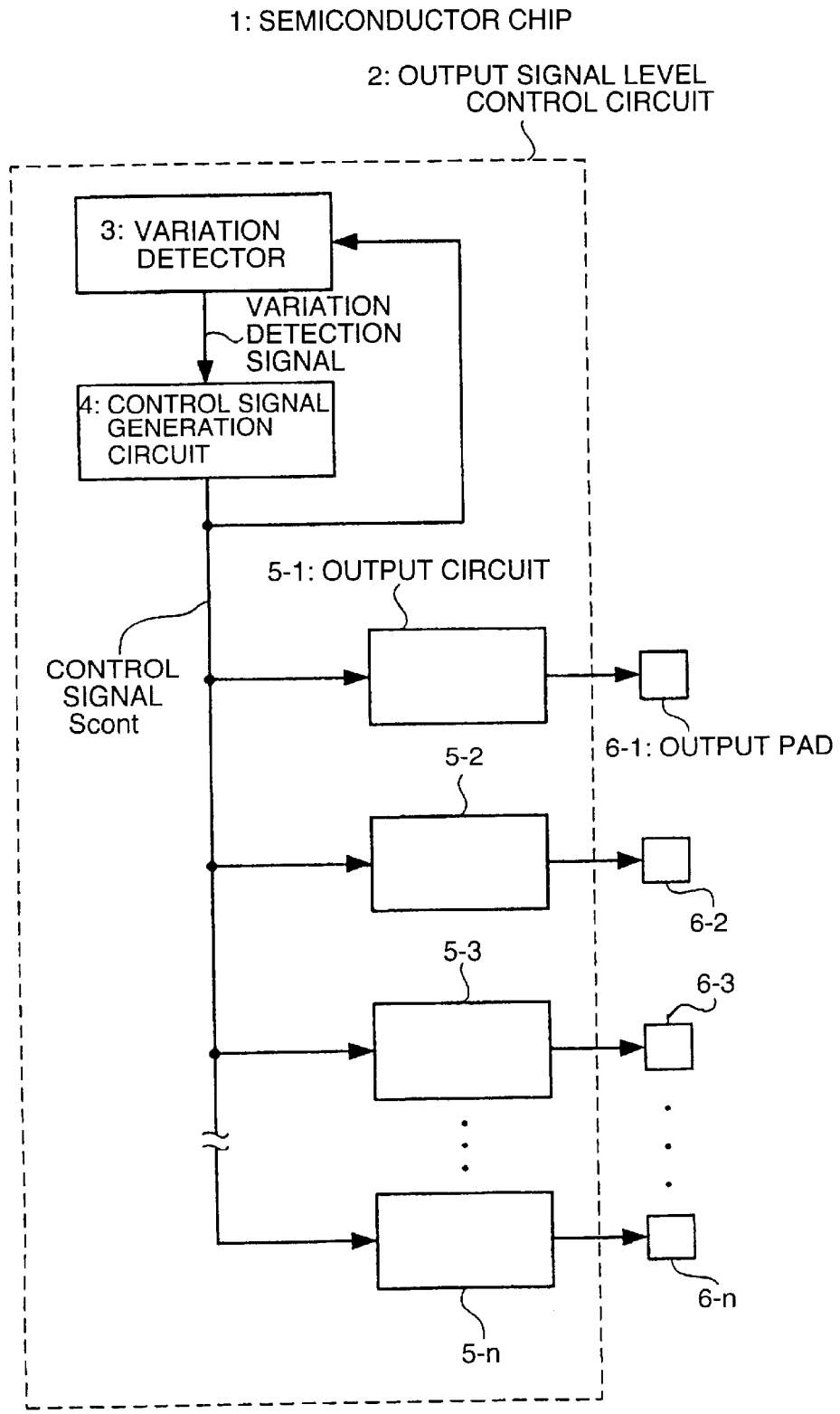
FIG. 2 is a block diagram of a semiconductor device according to a first embodiment of the invention.

FIG. 2 is a block diagram showing a semiconductor device according to the first embodiment of the invention. A semiconductor 1 is provided with an output signal level control circuit 2 which comprises a detection circuit or detector 3 for detecting the amount of variation (hereinafter referred to as a variation detector 3), a control signal generation circuit 4, and a plurality of output circuits 5-1~5-n connected respectively to a plurality of output pads 6-1~6-n. The variation detector 3 serves as a pulse signal output circuit for detecting variation in a power supply voltage, variation in ambient temperature and variation in fabrication of wafers, and outputting a variation detection signal in response to detected amounts of variation. The control signal generation circuit 4 generates a control signal Scont in response to the variation detection signal and supplies the control signal Scont to the plurality of output circuits 5-1~5-n. The output circuits 5-1~5-n have the same circuit configuration.

Figure 3:
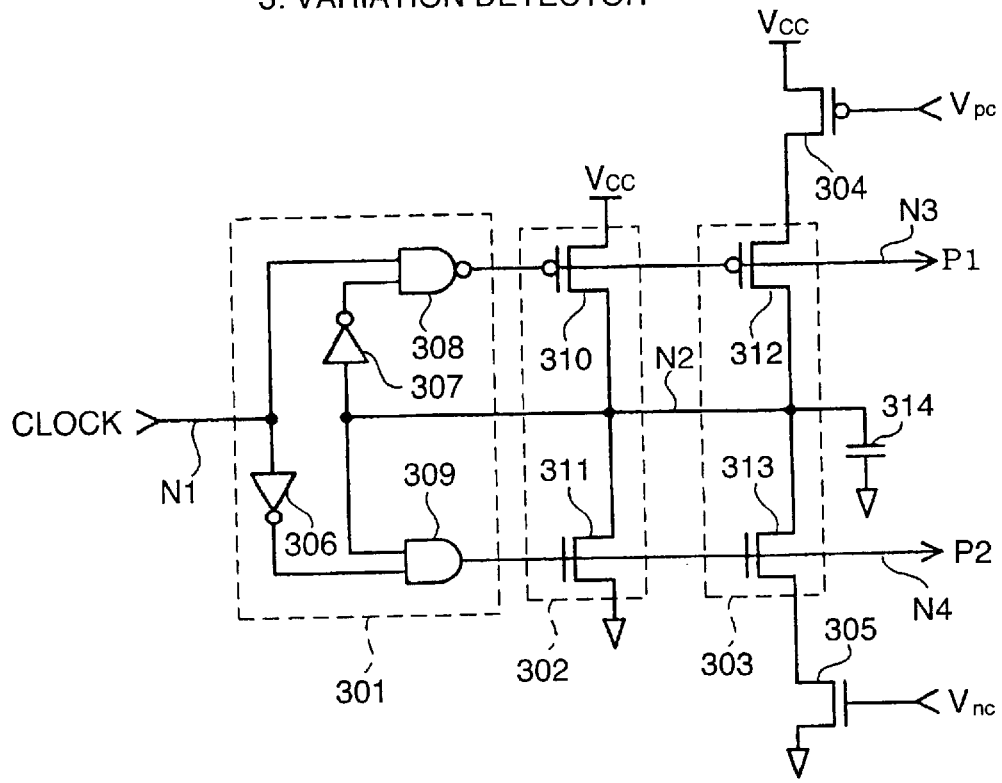
FIG. 3 is a circuit diagram of a variation detector for detecting the amount of variation according to the first embodiment of the invention.

First, the variation detector 3 has a circuit configuration as shown in FIG. 3. The variation detector 3 comprises a rise/fall time detection part 301, an inverter part 302, an auxiliary inverter part 303 serving as a pulse width regulating means, a p-channel transistor 304, an n-channel transistor 305 and a capacitor 314. The rise/fall time detection part 301 comprises two inverters 306, 307, a NAND gate 308 and an AND gate 309. The inverter part 302 comprises a p-channel transistor 310 and an n-channel transistor 311. The auxiliary inverter part 303 comprises a p-channel transistor 312 and an n-channel transistor 313.

The connecting relation between each component of the variation detector 3 is explained as follows.

An input terminal of the inverter 306 and one input terminal of the NAND gate 308 are connected to a node N1 respectively to which a clock signal CLOCK is inputted. An output terminal of the inverter 306 is connected to one input terminal of the AND gate 309 while an output terminal of the inverter 307 is connected to the other input terminal of the NAND gate 308. An input terminal of the inverter 307, the other input terminal of the AND gate 309, a drain terminal (hereinafter referred to as a drain) of the p-channel transistor 310, a drain of the n-channel transistor 311, a drain of the p-channel transistor 312, a drain of the n-channel transistor 313 and one end of the capacitor 314 are connected respectively to a node N2. An output terminal of the NAND gate 308, a gate terminal (hereinafter referred to as a gate) of the p-channel transistor 310, and a gate of the p-channel transistor 312 are connected respectively to a node N3. An output terminal of the AND gate 309, a gate of the n-channel transistor 311, and a gate of the n-channel transistor 313 are connected respectively to a node N4. A power supply voltage Vcc is applied to a source terminal (hereinafter referred to as a source) of the p-channel transistor 310 and a source of the p-channel transistor 304, while a ground voltage is applied to a source of the n-channel transistor 311, a source of the n-channel transistor 305 and the other end of the capacitor 314. A drain of the p-channel transistor 304 is connected to a source of the p-channel transistor 312 while a drain of the n-channel transistor 305 is connected to a source of the n-channel transistor 313.

The p-channel transistor 304 is configured that a p-channel transistor control voltage Vpc outputted from a control signal generation circuit 4, described later, is applied to the gate thereof Meanwhile, the n-channel transistor 305 is configured that an n-channel transistor control voltage Vnc is applied to the gate thereof. The p-channel transistor 304 and the n-channel transistor 305 can nullify the function of the variation detector 3 for detecting variation in a power supply voltage, variation in ambient temperature, and variation in fabrication of wafers.

Figure 4:
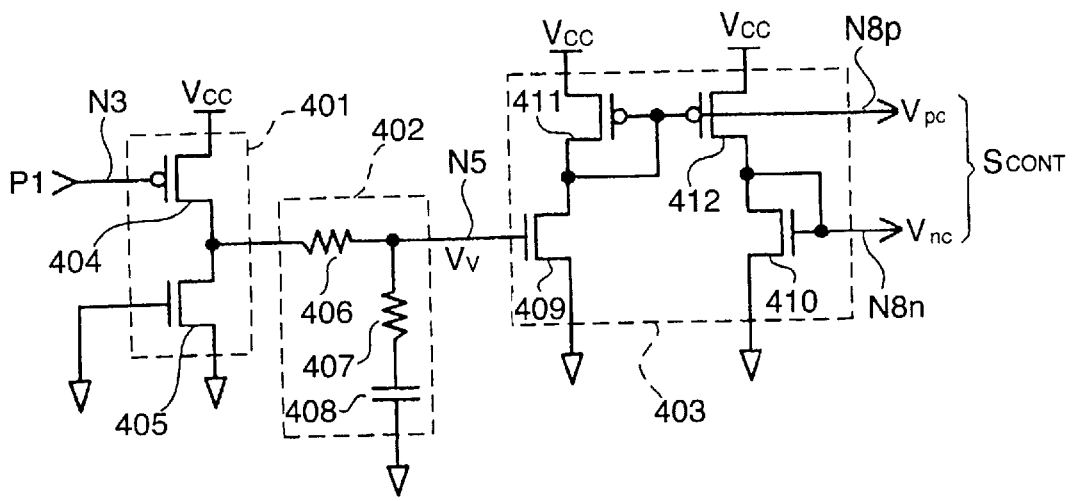
FIG. 4 is a circuit diagram of a control signal generation circuit according to the first embodiment of the invention.

Next, the control signal generation circuit 4 comprises, as shown in FIG. 4, a charge pump circuit 401, a low pass filter 402, and a current mirror circuit 403.

The charge pump circuit 401 includes a p-channel transistor 404 and an n-channel transistor 405. The low pass filter 402 includes two resistors 406, 407 and a capacitor 408. The current mirror circuit 403 includes two n-channel transistors 409, 410 and two p-channel transistors 411, 412.

The nodes N3, N4 in the variation detector 3 become connection nodes between the variation detector 3 and the control signal generation circuit 4. If the node N3 is used for connecting between the variation detector 3 and the control signal generation circuit 4, a gate of the p-channel transistor 404 is connected to the node N3 as shown in FIG. 4 while a ground voltage is applied to the gate of the n-channel transistor 405. On the other hand, if the node N4 is used for connecting between the variation detector 3 and the control signal generation circuit 4, a gate of the n-channel transistor 405 is connected to the node N4 while a power supply voltage Vcc is applied to the gate of the p-channel transistor 404.

The power supply voltage Vcc is applied to a source of the p-channel transistor 404 while a ground voltage is applied to a source of the n-channel transistor 405. A drain of the p-channel transistor 404 and a drain of the n-channel transistor 405 are connected respectively to one end of the resistor 406. The other end of the resistor 406 and one end of the resistor 407 are connected respectively to a node N5. The ground voltage is applied to the other end of the resistor 407 via the capacitor 408. Although the low pass filter 402 is a lug lead type filter, it can employ other circuit configurations.

A gate of the n-channel transistor 409 is connected to the node N5 while the ground voltage is applied to a source thereof. A drain of the n-channel transistor 409, a gate of the p-channel transistor 411, a drain of the p-channel transistor 411 and a gate of the p-channel transistor 412 are connected respectively to a node N8p. A gate of the n-channel transistor 410, a drain of the n-channel transistor 410, and a drain of the p-channel transistor 412 are connected respectively to a node N8n. The ground voltage is applied to respective sources of the n-channel transistor 409 and n-channel transistor 410 while the power supply voltage Vcc is applied to respective sources of the p-channel transistor 411 and p-channel transistor 412.

Figure 5:
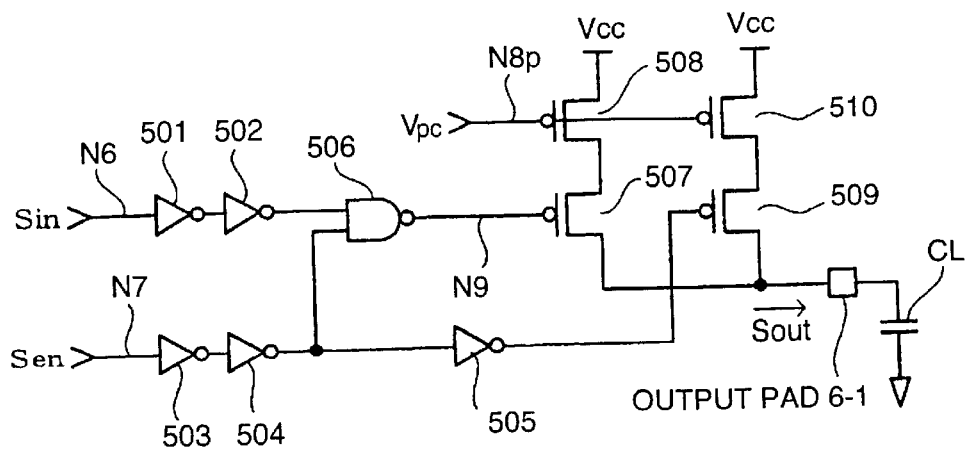
FIG. 5 is a circuit diagram of an output circuit according to the first embodiment of the invention.

FIG. 5 is a view showing a circuit configuration of an output circuit 5-1. Respective output circuits 5-1~5-n have substantially the same circuit configurations. Accordingly, the circuit configuration of the output circuit 5-1 is typically explained now.

The output circuit 5-1 comprises five inverters 501~505, a NAND gate 506, two p-channel transistors 507, 509, and two p-channel transistors 508, 510.

The inverters 501, 502 are serially connected to each other in the forward direction relative to a node N6 to which a high speed signal Sin transferred from the inside or outside of the semiconductor chip 1 is inputted. Likewise, the inverters 503, 504 are serially connected to each other in the forward direction relative to a node N7 to which an enable signal Sen transferred from the inside or outside of the semiconductor chip 1 is inputted. One input terminal of the NAND gate 506 is connected to an output terminal of the inverter 502 while the other input terminal of the NAND gate 506 is connected to an output terminal of the inverter 504 and an input terminal of the inverter 505.

An output terminal of the NAND gate 506 is connected to a gate of the p-channel transistor 507 while an output terminal of the inverter 505 is connected to a gate of the p-channel transistor 509. A source of the p-channel transistor 507 is connected to a drain of the p-channel transistor 508 while a source of the p-channel transistor 509 is connected to a drain of the p-channel transistor 510. Respective gates of the p-channel transistor 508 and p-channel transistor 510 are commonly connected to the node N8p. The power supply voltage Vcc is applied to respective sources of the p-channel transistor 508 and p-channel transistor 510. Respective drains of the p-channel transistor 507 and p-channel transistor 509 are commonly connected to one end of an external load CL via the output pad 6-1. The ground voltage is applied to the other end of the external load CL.

As mentioned above, the circuit configuration of the output circuit 5-1 is an open drain type of the p-channel transistor, and it may be an open drain type of the n-channel transistor or push-pull type of the n-channel transistor.

The control signal generation circuit 4 outputs the p-channel transistor control voltage Vpc to the node N8p while the n-channel transistor control voltage Vnc is outputted to the node N8n as shown in FIG. 4.

Figure 1:
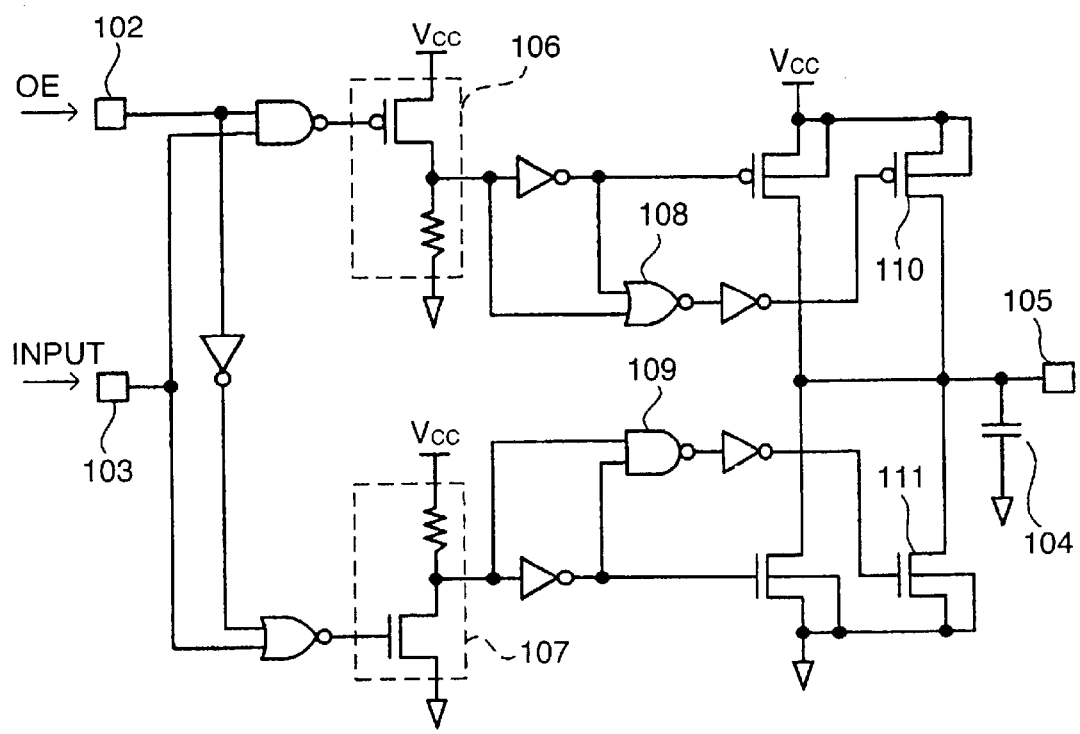
FIG. 1 is a circuit diagram of an output circuit according to a conventional semiconductor device.

The p-channel transistor control voltage Vpc and the n-channel transistor control voltage Vnc configure the control signal Scont as shown in FIG. 1 and they are outputted respectively to the variation detector 3 and the output circuits 5-1~5-n. More in detail, as shown in FIG. 3, the p-channel transistor control voltage Vpc is applied to the gate of the p-channel transistor 304 provided in the variation detector 3 while the n-channel transistor control voltage Vnc is applied to the gate of the n-channel transistor 305 provided in the variation detector 3. Meanwhile, either the p-channel transistor control voltage Vpc or the n-channel transistor control voltage Vnc is applied to the output circuits 5-1~5-n. Since each output circuits 5-1~5-n is configured as an open drain type of the p-channel transistor as shown in FIG. 5, the gates of the p-channel transistor 508 and p-channel transistor 510 provided therein are connected respectively to the node N8p, while the p-channel transistor control voltage Vpc is applied to the gates of the p-channel transistor 508 and p-channel transistor 510. On the other hand, since the node N8n is rendered electrically open, the n-channel transistor control voltage Vnc outputted from the control signal generation circuit 4 is not applied to the output circuits 5-1~5-n. However, if the circuit configurations of the output circuits 5-1~5-n are open drain types of the n-channel transistors, the n-channel transistor control voltage Vnc is used instead of the p-channel transistor control voltage Vpc.

The operation of the semiconductor chip 1 according to the first embodiment of the invention having the circuit configuration set forth above is now described.

The operation of the variation detector 3 is first described with reference to FIGS. 3 and 6. The clock signal CLOCK which is externally inputted to the semiconductor chip 1 or generated inside the semiconductor chip 1 is inputted to the node N1. The period of the clock signal CLOCK is set to intervals of time when the variation detector 3 detects the amounts of various variations. When the clock signal CLOCK is inputted to the node N1 as shown by a waveform a in FIG. 6, the p-channel transistor 310 provided in the variation detector 3 is rendered conductive so that the charging of the capacitor 314 is started as shown by a waveform b in FIG. 6. Thereafter, voltages at the nodes N1, N2 are compared with each other by the inverter 307 and the NAND gate 308 so that a first pulse signal P1 is outputted to the node N3 in response to the rise time of the voltage at the node N2 as shown by a waveform c in FIG. 6.

Figure 6:
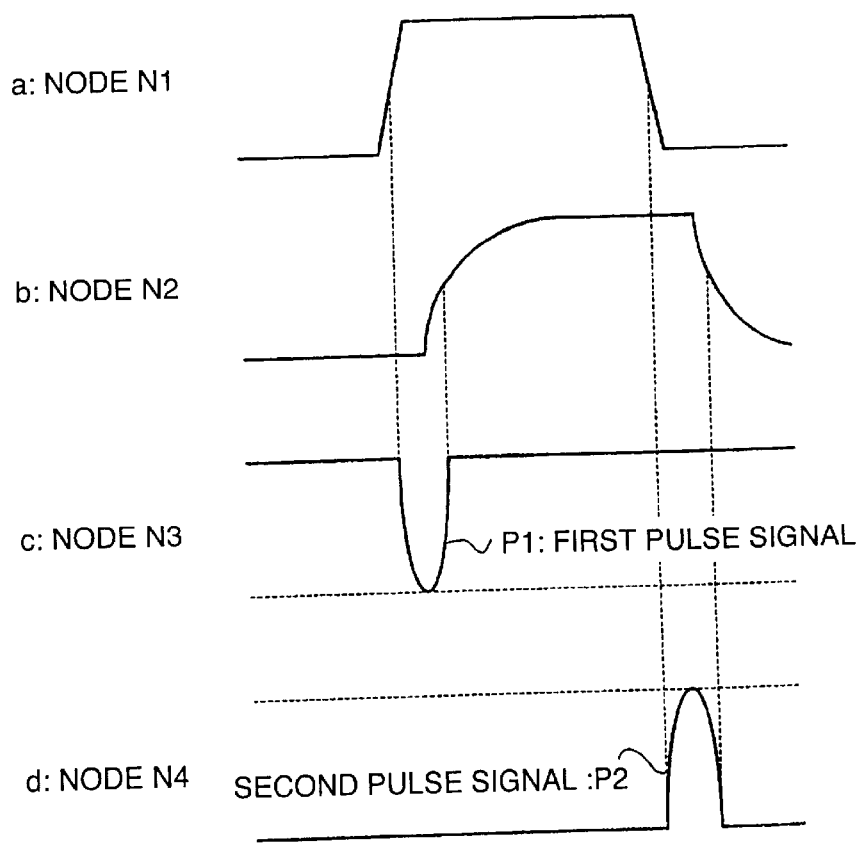
FIG. 6 shows waveforms of pulse signals at nodes N1 to N4 according to the first embodiment of the invention.

Next, when the clock signal CLOCK falls as shown by the waveform a in FIG. 6, the capacitor 314 is discharged by the n-channel transistor 311 as shown by the waveform b is FIG. 6. At this time, voltages at the nodes N1, N2 are compared with each other by the inverter 306 and the AND gate 309 so that a second pulse signal P2 is outputted to the node N4 in response to the fall time of the voltage at the node N2 as shown by a waveform d in FIG. 6. The first and second pulse signals P1, P2 correspond to the variation detection signal respectively as shown in FIG. 2. In the starting stage of detection of the amount of variation, both the p-channel transistor 304 and the n-channel transistor 305 are rendered nonconductive (off state) so that the detecting function of the variation detector 3 becomes effective.

If there occur variation in the power supply voltage Vcc, variation in ambient temperature, variation in fabrication of the wafers and the like in the semiconductor chip, time for charging or discharging the capacitor 314 is varied due to the phenomenon of these variations. As a result, pulse widths in the first pulse signal P1 and second pulse signal P2 are varied in response to variation in such a charging or discharging time.

For example, when there occurs variation in power supply voltage Vcc, time for charging or discharging the capacitor 314 is delayed in response to the decrease of the voltage so that pulse widths of the first pulse signal P1 and second pulse signal P2 become wider. On the contrary, if the power supply voltage Vcc increases, the pulse widths of the first pulse signal P1 and second pulse signal P2 become narrower in response to the increase of the voltage.

Further, if there occurs variation in ambient temperature, time for charging or discharging the capacitor 314 is varied in response to the amount of variation thereof so that the pulse widths of the first pulse signal P1 and second pulse signal P2 are varied. Even if there occurs variation in various conditions in fabrication of wafers, time for charging or discharging the capacitor 314 is varied so that the pulse widths of the first pulse signal P1 and second pulse signal P2 are varied.

That is, if the pulse widths of the first pulse signal P1 and second pulse signal P2 which are actually detected by the variation detector 3 are substantially the same as the pulse widths of those under the condition that there do not occur variation in the power supply voltage Vcc, variation in ambient temperature and variation in fabrication of wafers, namely, under the optimum condition, it is decided that the foregoing semiconductor chip 1 is under the optimum condition. Meanwhile, if the amount of variation detected by the variation detector 3 is within the amount of variation to be detected, the electrostatic capacitance of the capacitor 314 is set to a value to the extent that the first pulse signal P1 and second pulse signal P2 each having a given width (e.g., about several ten picoseconds) are outputted.

The first pulse signal P1 is inputted to the gate of the p-channel transistor 404 constituting the charge pump circuit 401 provided in the control signal generation circuit 4. If the node N3 is used for connecting between the variation detector 3 and the control signal generation circuit 4, the gate of the p-channel transistor 404 is connected to the node N3 while the ground voltage is applied to the gate of the n-channel transistor 405. Further, if the node N4 is used for connecting between the variation detector 3 and the control signal generation circuit 4, the gate of the n-channel transistor 405 is connected to the node N4 while the power supply voltage Vcc is applied to the gate of the p-channel transistor 404. That is, the charge pump circuit 401 is operated in response to the first pulse signal P1 or second pulse signal P2, and outputs the variation voltage Vv serving as a pulse width conversion signal to the node N5 via the low pass filter 402. If the node N3 is used, the variation voltage Vv is grounded level GND or rendered to be the ground voltage GND as an initial value. Meanwhile when the node N4 is used, the variation voltage Vv is rendered to be the power supply voltage Vcc as an initial value. However, there is described here a case where the node N3 is used in the first embodiment as shown in FIG. 4.

Figure 7:
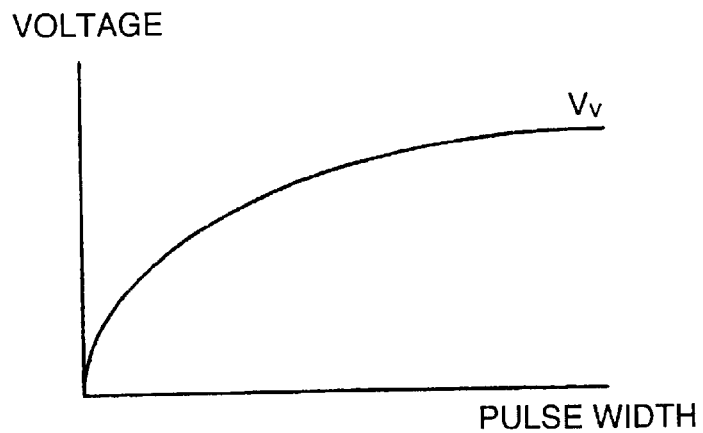
FIG. 7 is a view showing a voltage value relative to a pulse width of a variation voltage Vv according to the first embodiment of the invention.

The voltage value of the variation voltage Vv increases in response to the pulse width of the first pulse signal P1 as shown in FIG. 7. The characteristic of the variation voltage Vv is determined by the resistors 406, 407 and the capacitor 408 constituting the low pass filter 402 respectively.

Figure 8:
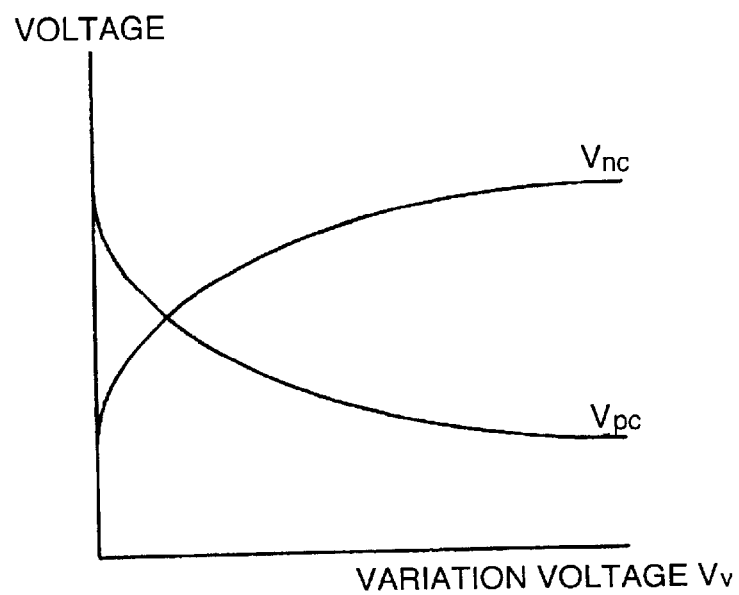
FIG. 8 is a view showing a voltage value relative to the variation voltage Vv of a p-channel transistor control voltage Vpc and an n-channel transistor control voltage Vnc according to the first embodiment of the invention.
Figure 9:
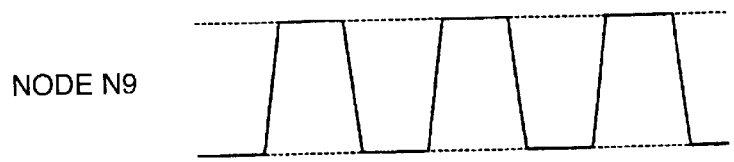
FIG. 9A shows a waveform of a signal at a node N9 according to the first embodiment of the invention.
FIG. 9B shows a waveform 6f an output signal Sout according to the first embodiment of the invention.
Figure 9:
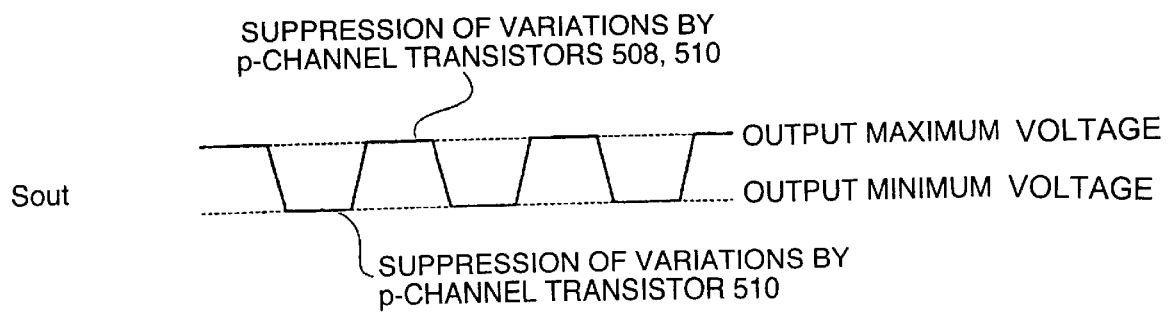

The variation voltage Vv is applied to the gate of the n-channel transistor 409 constituting the current mirror circuit 403 via the node N5. As shown in FIG. 8, the current mirror circuit 403 quickly outputs the p-channel transistor control voltage Vpc to the node N8p in response to variation in variation voltage Vv and also quickly outputs the n-channel transistor control voltage Vnc to the node N8n. That is, the current mirror circuit 403 can fully cope with variation in the high frequency power supply voltage Vcc. Further, the voltage levels of the p-channel transistor control voltage Vpc and n-channel transistor control voltage Vnc can be easily regulated to appropriate values by the current mirror circuit 403.

The operations of the output circuits 5-1~5-n are described now with reference to FIGS. 9A and 9B. These output circuits 5-1~5-n are configured by open drain types of the p-channel transistors, and the p-channel transistor control voltage Vpc outputted from the control signal generation circuit 4 is inputted to the gates of the p-channel transistor 508, p-channel transistor 510 provided in these output circuits 5-1~5-n. If the output circuits 5-1~5-n are configured by open drain types of, e.g., the n-channel transistors, the n-channel transistor control voltage Vnc is used.

If the output signal Sout is outputted from the output circuit 5-1 in the semiconductor chip 1, an H-level enable signal Sen is first inputted to the node N7. If the high speed signal Sin transferred from the inside or outside of the semiconductor chip 1 is inputted to the node N6, the inverters 501, 502 and the NAND gate 506 are operated in response to the high speed signal Sin. Thereafter, a signal for controlling the p-channel transistor 507 is outputted from the NAND gate 506 to a node N9 as shown in FIG. 9A.

The p-channel transistor 507 is rendered conductive by the H-level high speed signal Sin while the p-channel transistor 509 is rendered conductive by the enable signal Sen. If the high speed signal Sin is changed to L-level, the p-channel transistor 507 is rendered nonconductive. At this time, the p-channel transistor 509 remains conductive by the enable signal Sen.

If the output circuit 5-1 is rendered enable by the high level enable signal Sen and the high speed signal Sin is H-level, the output signal Sout supplied to the output pad 6-1 becomes the sum of the signals outputted from the p-channel transistor 507 and the p-channel transistor 509. On the other hand, if the high speed signal Sin is L-level, the output signal Sout supplied to the output pad 6-1 becomes only a signal outputted from the p-channel transistor 509. That is, as shown in FIG. 9B, if the high speed signal Sin is H-level, the node N9 becomes L-level while the output signal Sout becomes H-level. On the contrary, if the high speed signal Sin is L-level, the node N9 becomes H-level while the output signal Sout becomes L-level.

The amount of current flowing to the source of the p-channel transistor 507 is regulated by the p-channel transistor 508 which is controlled by the p-channel transistor control voltage Vpc. The amount of current flowing to the source of the p-channel transistor 509 is regulated by the p-channel transistor 510 which is similarly controlled by the p-channel transistor control voltage Vpc. That is, when the p-channel transistor control voltage Vpc is regulated, H-level voltage and L-level voltage of each output signal Sout outputted by each outputted pad are regulated by regulating the p-channel transistor control voltage Vpc.

Meanwhile, the p-channel transistor control voltage Vpc is regulated based on variation in the power supply voltage Vcc, variation in ambient temperature, variation in fabrication of wafers and the like detected respectively by the variation detector 3. As a result, even if there occur variation in power supply voltage Vcc, variation in ambient temperature, variation in fabrication of wafers and the like, variation in H-level voltage of each output signal Sout is suppressed by the p-channel transistor 508 and p-channel transistor 510, and variation in L-level voltage is suppressed by the p-channel transistor 510.

Figure 10:
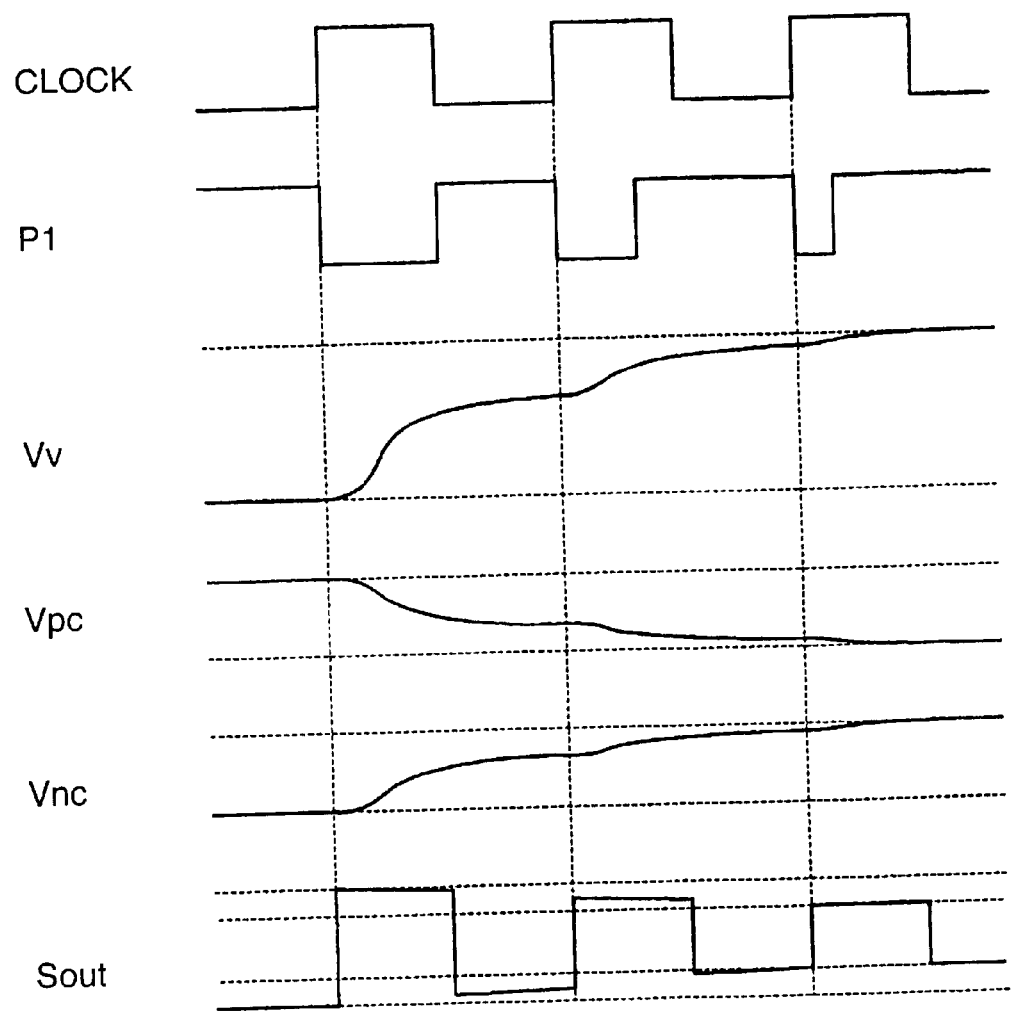
FIG. 10 is a view showing waveforms of various signals according to the first embodiment of the invention.

The p-channel transistor control voltage Vpc and the n-channel transistor control voltage Vnc which are fed back respectively from the control signal generation circuit 4 are inputted to the gate of the p-channel transistor 304 and the gate of the n-channel transistor 305 in the variation detector 3. As shown in FIG. 10, if the voltage of each output signal Sout is higher than that in a steady-state, the variation detector 3 outputs the first pulse signal P1 and second pulse signal P2 each having a large width respectively.(In FIG. 1, only the first pulse signal P1 is shown.) The pulse widths of the first pulse signal P1 and second pulse signal P2 become narrower every time the clock signal CLOCK is inputted to the variation detector 3 by the feedback of the p-channel transistor control voltage Vpc and the n-channel transistor control voltage Vnc. If the pulse widths of the first pulse signal P1 and second pulse signal P2 become narrower, the variation voltage Vv at the node N5 increases so that the p-channel transistor control voltage Vpc which is fed back from the control signal generation circuit 4 decreases while the n-channel transistor control voltage Vnc increases. As a result, the pulse widths of the first pulse signal P1 and second pulse signal P2 become further narrower so that they are converged on a given pulse width. As the first pulse signal P1 and second pulse signal P2 are converged on a given pulse width, the variation voltage Vv, the p-channel transistor control voltage Vpc and the n-channel transistor control voltage Vnc are converged on a steady-state value respectively. Accordingly, each output signal Sout is regulated to a steady-state value.

As explained above, according to the semiconductor device of the first embodiment, even if there occur variation in the power supply voltage Vcc, variation in ambient temperature variation in fabrication of wafers and the like, variation in the H-level voltage and L-level voltage of each output signal Sout outputted from the respective output pads 6-1~6-n are suppressed so that each output signal Sout serving as a stable small amplitude signal can be supplied to the external load CL on the basis of the high frequency high speed signal Sin.

If the variation detector 3 and the control signal generation circuit 4 are provided merely one by one, variation in the H-level voltage and L-level voltage of each output signal Sout outputted from the plurality of output circuits 5-1~5-n are suppressed respectively. Accordingly, it is possible to output a stable output signal Sout without increasing the area of the semiconductor chip 1.

Further, since the variation detector 3 is configured by basic elements such as the NAND gate, the AND gate, the p-channel transistor, the n-channel transistor, and the capacitor, the operation of the variation detector is extremely stabilized. Still further, the variation detector 3 has the simple circuit configuration as set forth above, a cell library used in application specific IC such as a gate array and an embedded array can be facilitated when designing a semiconductor.

Although the first pulse signal P1 and the second pulse signal P2 are converted into the variation voltage Vv in the control signal generation circuit 4, the conversion rate can be regulated by varying time constant (CR constant) in the low pass filter 402 provided in the control signal generation circuit 4. Accordingly, the variation voltage Vv can be easily regulated.

If it is expected that variation in each output signal Sout caused by variation in power supply voltage Vcc, variation in ambient temperature, variation in fabrication of wafers and the like become large, the sizes of the p-channel transistor 508 and p-channel transistor 510 provided in the respective output circuits 5-1~5-n may be enlarged so as to suppress the variations of the levels of the output signals from the respective output circuits 5-1~5-n.

Figure 11:
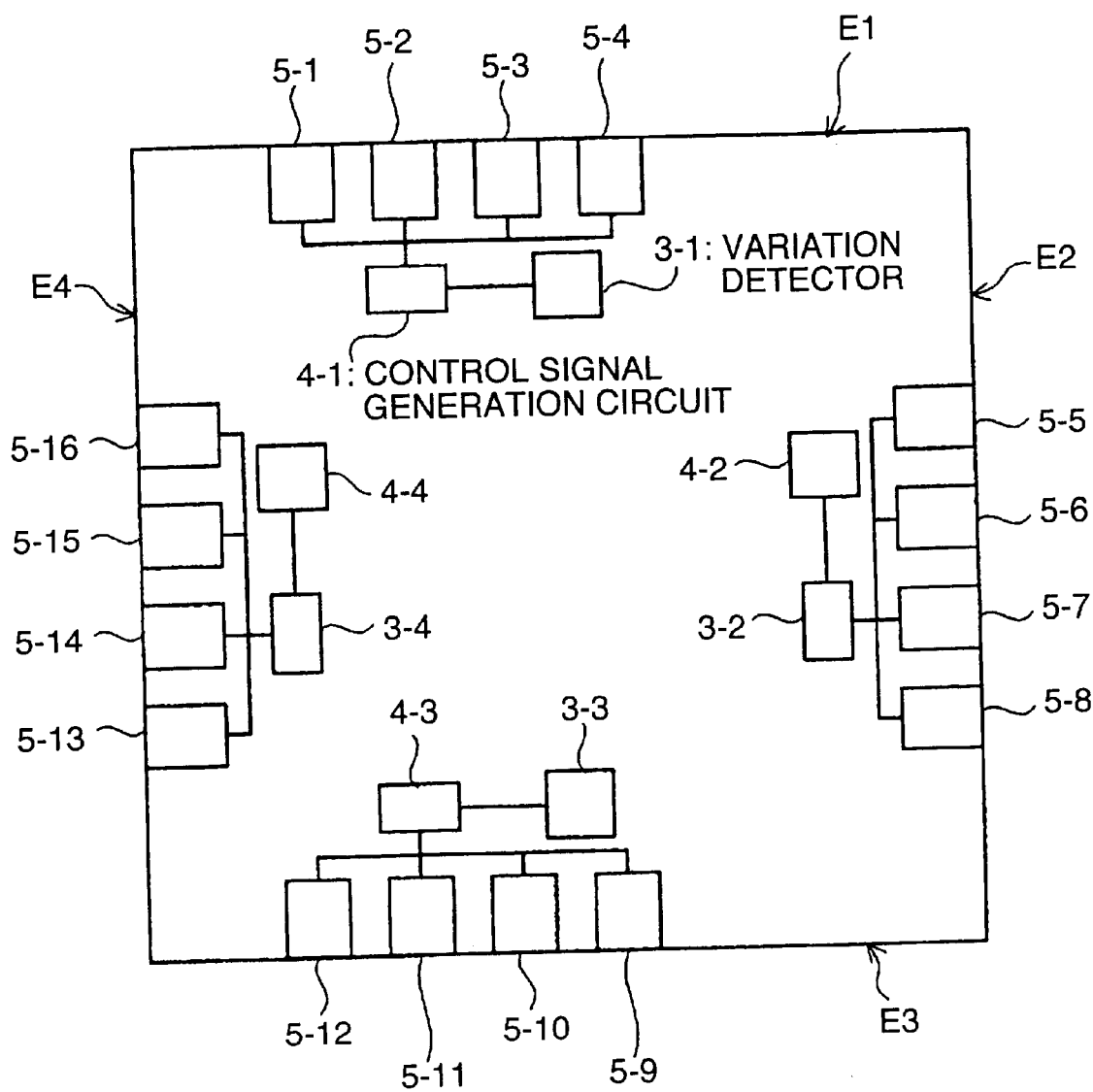
FIG. 11 is a view showing a layout of a semiconductor chip according to a second embodiment of the invention.

Second Embodiment (FIG. 11):

A semiconductor device according to a second embodiment of the invention is described now with reference to FIG. 11 which shows a layout of the semiconductor chip 1.

An input/output circuit is generally disposed in proximity to an outer edge of a semiconductor chip. In the case of a semiconductor chip 1 in FIG. 11, output circuits 5-1~5-16 are disposed on four edge portions E1, E2, E3, E4 of the semiconductor chip 1.

A variation detector 3-1 and a control signal generation circuit 4-1 are disposed respectively on the edge portion E1 of the semiconductor chip 1, wherein the output circuits 5-1~5-4 are connected in parallel to the control signal generation circuit 4-1. A variation detector 3-2 and a control signal generation circuit 4-2 are disposed respectively on the edge portion E2 of the semiconductor chip 1, wherein the output circuits 5-5~5-8 are connected in parallel respectively to the control signal generation circuit 4-2. A variation detector 3-3 and a control signal generation circuit 4-3 are disposed respectively on the edge portion E3 of the semiconductor chip 1, wherein the output circuits 5-9~5-12 are connected in parallel respectively to the control signal generation circuit 4-3. A variation detector 3-4 and a control signal generation circuit 4-4 are disposed respectively on the edge portion E4 of the semiconductor chip 1, wherein the output circuits 5-13~5-16 are connected in parallel respectively to the control signal generation circuit 4-4. The variation detectors 3-1~3-4 have the same circuit configurations and functions respectively as those of the variation detector 3 in FIG. 3. Further, the control signal generation circuits 4-1~4-4 have substantially the same circuit configurations and functions as those of the control signal generation circuit 4 shown in FIG. 4.

According to the semiconductor chip 1 having the forgoing layout, variation in power supply voltage Vcc, variation in ambient temperature, variation in fabrication of wafers and the like are detected in proximity to the four edge portions E1~E4 of the semiconductor chip 1, so that detection accuracy is enhanced. Accordingly, variation in all the output signals Sout outputted from the output circuits 5-1~5-16 are effectively suppressed.

Although the variation detectors 3-1~3-4 and control signal generation circuits 4-1~4-4 are disposed in proximity to the four edge portions E1~E4 of the semiconductor chip 1, the invention is not limited to this, for example, the variation detector 3 and control signal generation circuit 4 can be disposed on any portions of the semiconductor chip 1. That is, when increasing the portions of the semiconductor chip 1 where the variation detector 3 and control signal generation circuit 4 are disposed, detection accuracy of variation in power supply voltage Vcc, variation in ambient temperature, variation in fabrication of wafers and the like are more enhanced.

If the semiconductor chip 1 has a plurality of power supply lines, it is possible to detect variation in the plurality of power supply voltages by disposing the variation detector 3 and control signal generation circuit 4 every power supply lines. Accordingly, if there occurs variation in one of the plurality of power supply voltages, it is possible to suppress variation in output signals outputted from each output circuit which is operable by such a power supply voltage.

In the semiconductor chip 1 according to the first and second embodiments of the invention, even if there occur variation in power supply voltage Vcc, variation in ambient temperature, variation in fabrication of wafers and the like, variation in each output signal Sout can be automatically suppressed, so that it is possible to dispense with a simulation or improvement designing operation which have been conventionally needed for suppressing each output signal Sout when designing a circuit configuration. Accordingly, it is possible to shorten TAT (Turn Around Time) which is needed for designing the circuit configuration.

What is claimed is:

1. An output signal level control circuit in a semiconductor device, comprising:
    a pulse signal output circuit which charges or discharges a capacitor in response to a clock signal and which outputs a pulse signal having a pulse width in response to a time for charging or discharging the capacitor;
    a control signal generation circuit which outputs a control signal having a first voltage level in response to the pulse width; and
    output circuits which regulate a power supply voltage or a ground voltage supplied thereto respectively in response to the control signal and which output output signals each having a second voltage level in response to the power supply voltage or ground voltage
        wherein the pulse signal output circuit has a pulse width regulating circuit which regulates further, in response to the control signal, the pulse width of the pulse signal varied in response to the time for charging or discharging the capacitor.

2. The output signal level control circuit in a semiconductor device according to claim 1, further comprising a plurality of pulse signal output circuits, wherein the respective pulse signal output circuits disposed substantially at an equal interval in proximity to an outer edge of the semiconductor device.

3. The output signal level control circuit in a semiconductor device according to claim 2, wherein the semiconductor device further comprises a plurality of power supply lines and the respective pulse signal output circuits are assigned to each of the plurality of power supply lines.

4. An output signal level control circuit in a semiconductor device, comprising:
- a pulse signal output circuit for charging or discharging a capacitor in response to a clock signal and outputting a pulse signal having a pulse width in response to a time for charging or discharging the capacitor;
- a control signal generation circuit for outputting a control signal having a first voltage level in response to the pulse width; and
- output circuits for regulating a power supply voltage or a ground voltage supplied thereto respectively in response to the control signal and outputting output signals each having a second voltage level in response to the power supply voltage or ground voltage;
- wherein each output circuit comprises:
  - a first output transistor which controls a logical high level voltage of each output signal;
  - a second output transistor which controls a logical low level voltage of each output signal;
  - a first regulating transistor which regulates the power supply voltage or the ground voltage in response to the control signal and which supplies the regulated power supply voltage or ground voltage to the first output transistor; and
  - a second regulating transistor which regulates the power supply voltage or the ground voltage in response to the control signal and which supplies the regulated power supply voltage or ground voltage to the second output transistor.

5. The output signal level control circuit in a semiconductor device according to claim 4, wherein the first regulating transistor and the first output transistor are serially connected to each other between the power supply voltage or the ground voltage and output terminals thereof; and
- wherein the second regulating transistor and the second output transistor are serially connected to each other between the power supply voltage or the ground voltage and output terminals thereof.

6. An output signal level control circuit in a semiconductor device, comprising:
- a pulse signal output circuit for charging or discharging a capacitor in response to a clock signal and outputting a pulse signal having a pulse width in response to a time for charging or discharging the capacitor;
- a control signal generation circuit for outputting a control signal having a first voltage level in response to the pulse width; and
- output circuits for regulating a power supply voltage or a ground voltage supplied thereto respectively in response to the control signal and outputting output signals each having a second voltage level in response to the power supply voltage or ground voltage;
- wherein the control signal generation circuit comprises:
  - a low pass filter comprising resistor elements and a capacitor element for outputting a pulse width conversion signal having a third voltage level in response to the pulse width of the pulse signal; and
  - a current mirror circuit to which the pulse width conversion signal is inputted and from which the control signal is outputted.

7. An output signal level control circuit in a semiconductor device, comprising:
- a first power supply node which supplies a first power supply voltage;
- an output terminal which outputs an output signal;
- a pulse signal output circuit which charges and discharges a capacitor in response to a clock signal and which outputs a pulse signal having a pulse width determined by a time for charging and discharging the capacitor;
- a control signal generation circuit which outputs a control signal in response to the pulse signal, the control signal having a first voltage level determined by the pulse width; and
- an output circuit having a first output transistor and a first regulating transistor connected in series between the first power supply node and the output terminal, the first output transistor being operated in response to a signal transferred from inside or outside the semiconductor device, and the first regulating transistor being operated in response to the control signal.

8. The output signal level control circuit according to claim 7, wherein the pulse signal output circuit has a pulse width regulating circuit which regulates the pulse width in response to the control signal.

9. The output signal level control circuit according to claim 7, wherein the control signal generation circuit comprises:
- a low pass filter which has a resistor element and a capacitor element, and which outputs a pulse width conversion signal; and
- a current mirror circuit which receives the pulse width conversion signal and outputs the control signal.

10. The output signal level control circuit according to claim 7, wherein the output circuit further comprises:
- a second output transistor and a second regulating transistor connected in series between the first power supply node and the output terminal, the second output transistor being operated in response to an enable signal, the second regulating transistor being operated in response to the control signal.

11. The output signal level control circuit according to claim 10,
- wherein the first regulating transistor regulates the first power supply voltage in response to the control signal and supplies the regulated first power supply voltage to the first output transistor and the second regulating transistor regulates the first power supply voltage in response to the control signal and supplies the regulated first power supply voltage to the second output transistor.

12. The output signal level control circuit according to claim 7, wherein the control signal is different from a signal which controls the first output transistor.

13. The output signal level control circuit according to claim 7, wherein the pulse signal output circuit comprises:
- an input terminal which receives the clock signal;
- a first node;
- a first MOS transistor connected between the first power supply node and the first node;
- a second power supply node which supplies a second power supply voltage;
- a second MOS transistor connected between the first node and the second power supply voltage;
- a first logical circuit connected between the input terminal and a gate electrode of the first MOS transistor, the first logical circuit being controlled by a potential of the first node and the clock signal; and
- a second logical circuit connected between the input terminal and a gate electrode of the second MOS transistor, the second logical circuit being controlled by the potential of the first node and the clock signal.

14. The output signal level control circuit according to claim 13, wherein the capacitor is controlled between the first node and the second power supply node and wherein the capacitor is charged and discharged in response to the clock signal inputted to the input terminal of the pulse signal output terminal.

15. The output signal level control circuit according to claim 7, further comprising:

a plurality of pulse signal output circuits, wherein the respective pulse signal output circuits are disposed substantially at an equal interval in proximity to an outer edge of the semiconductor device.

16. The output signal level control circuit according to claim 15, wherein the semiconductor device further comprises a plurality of power supply lines each of which is connected to the pulse signal output circuits, respectively.

* * * * *